United States Patent [19]

Komiyama et al.

[11] Patent Number: 5,017,988
[45] Date of Patent: May 21, 1991

[54] IMAGE READING DEVICE WITH PROTECTIVE LAYERS

[75] Inventors: Katsumi Komiyama; Masaki Fukaya, both of Isehara; Kojiro Yokono, Yokohama; Hitoshi Toma, Kawasaki, all of Japan

[73] Assignee: Canon Kabushiki Kaisha, Tokyo, Japan

[21] Appl. No.: 475,004

[22] Filed: Feb. 5, 1990

Related U.S. Application Data

[63] Continuation of Ser. No. 384,904, Jul. 25, 1989, Pat. No. 4,924,282, which is a continuation of Ser. No. 310,467, Feb. 15, 1989, abandoned, which is a continuation of Ser. No. 104,072, Oct. 5, 1987, abandoned.

[30] Foreign Application Priority Data

| Oct. 7, 1986 | [JP] | Japan | 61-237061 |
| Oct. 7, 1986 | [JP] | Japan | 61-237062 |
| Oct. 7, 1986 | [JP] | Japan | 61-237063 |
| Jun. 12, 1987 | [JP] | Japan | 62-145355 |

[51] Int. Cl.$^5$ .......................................... H01L 27/14
[52] U.S. Cl. ...................................... 357/30; 357/32; 357/54; 357/2
[58] Field of Search ............... 357/30 H, 30 L, 30 G, 357/30 S, 30 K, 32, 54, 2, 49

[56] References Cited

U.S. PATENT DOCUMENTS

| 4,419,533 | 12/1983 | Czubatyj et al. | 357/30 L X |
| 4,691,243 | 9/1987 | Cannella et al. | 357/30 H X |

FOREIGN PATENT DOCUMENTS

| 0075858 | 4/1983 | European Pat. Off. | 357/30 H |
| 54-113286 | 9/1979 | Japan | 357/30 H |
| 55-74262 | 6/1980 | Japan . |
| 55-75271 | 6/1980 | Japan . |
| 56-45084 | 4/1981 | Japan . |
| 56-122172 | 9/1981 | Japan . |

Primary Examiner—William Mintel
Attorney, Agent, or Firm—Fitzpatrick, Cella, Harper & Scinto

[57] ABSTRACT

An image reading device has an entrance window provided in a substrate for receiving the light illuminating an information bearing member bearing information to be read. A photosensor is provided on the substrate for receiving the light that has entered through the entrance window and has been reflected by the information bearing member. Further, a protective layer is formed on the photosensor opposite to the substrate, in order to maintain a constant distance between the information bearing member and the photosensor, and has a multi-layer structure of separate functions, comprising a first layer of a first function at the side of the photosensor, and a second layer of another function different from the first function.

5 Claims, 5 Drawing Sheets

IMAGE READING DEVICE WITH PROTECTIVE LAYERS

This application is a continuation of U.S. application Ser. No. 384,904, filed on July 25, 1989, now U.S. Pat. No. 4,924,282, which is a continuation of U.S. application Ser. No. 310,467, filed on Feb. 15, 1989, which is a continuation of U.S. application Ser. No. 104,072, filed on Oct. 5, 1987, both now abandoned.

BACKGROUND OF THE INVENTION

1. Field of the Invention

The present invention relates to an image reading device, and, more particularly, an image reading device having for example a linear image sensor and reading image information by relative movement of an information bearing member, such as an original document, in contact with said linear image sensor, and adapted for use in a facsimile apparatus, a copying machine, an image reader or the like.

2. Related Background Art

In the field of image reading device utilizing linear image sensor, there is already known a device for reading an original image by focusing said image onto a linear image sensor of a length of several centimeters in the main scanning direction, through a reduction optical system. However such device requires a large optical path for reduction imaging, and cannot be easily compactized since the optical system requires a large space for housing it.

On the other hand, the use of an equal-size optical system employing a linear image sensor of a length substantially equal to the width of the original image allows to significantly reduce the space required for housing the optical system, thereby compactizing the reading apparatus. Such equal-size optical system is already known to be realizable with light concentrating fibers or with a contact lens array. Also recently there has been developed an image reading device of contact type in which the original document is moved in contact with the linear image sensor without such fibers or lens array, as disclosed in the Japanese Patent Laid-open Nos. 74262/1980, 75271/1980, 45084/1981 and 122172/1981 by the present applicant.

FIG. 1 is a partially cut-off lateral cross-sectional view of a principal portion of such a conventional image reading device of contact type, provided with photosensor portions or photosensor elements 8, arranged on a transparent substrate 11 such as glass, in a direction perpendicular to the plane of drawing to constitute a linear image sensor.

Said sensor element 8 is composed, on a transparent substrate 11 such as glass, of an opaque layer 12 of an opaque material, such as metal; an insulating layer 13 of an electrically insulating material; a semiconductor layer 14 of a photoconductive semiconductor material such as hydrogenated amorphous silicon (a-Si:H) or CdS.Se; a semiconductor layer 15 doped with semiconductive impurities for forming ohmic contacts; and a pair of main electrodes 16, 17, defining a light-receiving window 18 therebetween.

In such a structure, incident light L entering the transparent substrate 11 through an entrance window 19 formed thereon (the sensor 8 is protected from said incident light by the opaque layer 12) illuminates an original document P, and the reflected light is received by the light-receiving window 18 of the sensor 8, whereby a photocurrent generated between the electrodes 16, 17 through the semiconductor layer 14 is obtained as a readout signal through wirings (not shown).

A reading resolving power of 4–8 lines/mm can be obtained when the distance between the original document P and the sensor 8 is maintained in the order of 0.1 mm, and the distance has to be strictly controlled in order to maintain the above-mentioned resolving power. Accurate controlling the distance is achieved by forming, on the sensor 8, a protective layer 20 antiabrasive to the contact with the original document P.

The protective layer 20 is required to satisfy at least following three functions. A first function is to maintain a constant distance between the sensor element 8 and the original document P, i.e. a spacer function for maintaining an exact spacing between the light-receiving face of the window 18 and the original document P.

A second function is to prevent the deterioration of the sensor element 8 by abrasion, when the original document P is contacted therewith.

A third function is to secure the stability of the sensor element 8 against changes in ambient conditions such as temperature and humidity.

Conventionally, the protective layer 20 has been formed by adhering a translucent material, such as glass, to the substrate 11 so as to cover the sensor element 8, and said adhesion has been obtained by applying an adhesive material to the unillustrated peripheral or end portions of the device. However, such structure in which the glass protective layer and the substrate are both relatively rigid, there is encountered a drawback of a bending stress caused by temperature change, due to the difference in the thermal expansion coefficient of the protective layer and the substrate, or a stress resulting from uneven adhesion, giving eventually rise to mechanical destruction.

Also, such a structure results in an air gap between the protective layer 20 and the light-receiving window 18, leading to a deterioration in image quality and an insufficient ambient stability of the light-receiving face defined by the window 18. In order to avoid such drawback, the adhesive material may be applied on the upper surface of the substrate 11 or of the light-receiving window 18, but the adhesive material generally has an insufficient purity and is unable to ensure a sufficient light transmission, thus deteriorating the reading characteristic of the light-receiving window.

The protective layer 20 may also be formed of a photocurable resin, but there will be encountered drawbacks as first mentioned due to the contraction at resin curing, and the difference in thermal expansion coefficient. Also such resin deteriorates the reading characteristic of the light-receiving face because of the low degree of purificaiton of such resin.

SUMMARY OF THE INVENTION

An object of the present invention is to resolve such drawbacks and to provide an image reading device with improved durability, capable of relaxing the stress resulting from temperature change or adhesion for preventing the cracks in the protective layer or substrate, and still capable of maintaining a high resolving power.

Another object of the present invention is to provide an image reading device without deterioration in the reading characteristics or image quality.

Still another object of the present invention is to provide an image reading device capable of ensuring stability of the light-receiving unit in the ambient conditions.

Still another object of the present invention is to provide an image reading device provided with:
a substrate;
an entrance window provided in said substrate and receiving the light illuminating an information bearing member, bearing information to be read;
a photosensor provided on said substrate for receiving the light that has entered through said entrance window and has been reflected by said information bearing member; and
a protective layer formed on said photosensor opposite to said substrate, in order to maintain a constant distance between said information bearing member and said photosensor;
wherein said protective layer has a multi-layer structure of separate functions, comprising a first layer of a first function at the side of photosensor, and a second layer of another function different from said first function.

BRIEF DESCRIPTION OF THE DRAWINGS

FIGS. 3A, 3B and 3C are schematic views of a principal portion of an image reading device in which a photosensor, a charge accumulating unit, a switch unit etc. are integrally formed, wherein FIG. 3A is a plan view thereof, FIG. 3B is a cross-sectional view along a line B—B, and FIG. 3C is a cross-sectional view along a line C—C;

DETAILED DESCRIPTION OF THE PREFERRED EMBODIMENTS

Now the present invention will be clarified in detail by embodiments thereof shown in the attached drawings.

Figure 1:
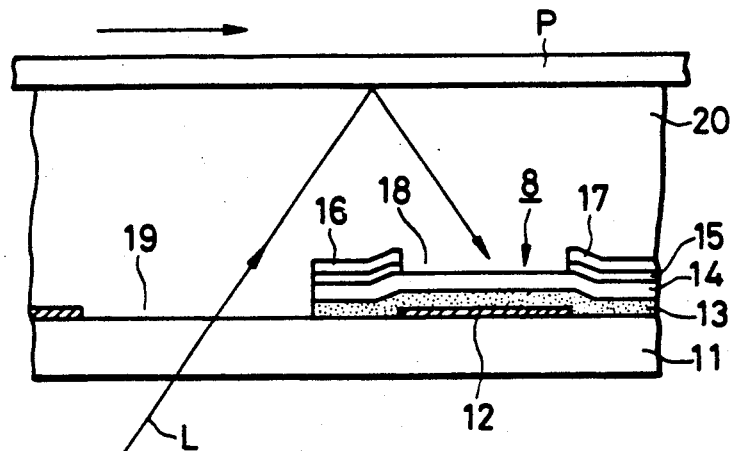
FIG. 1 is a schematic lateral cross-sectional view of a conventional image reading device.
Figure 2A:
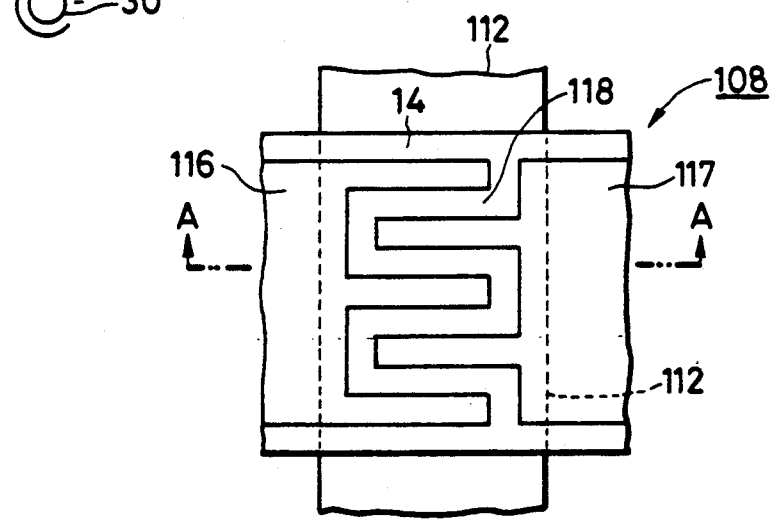
FIG. 2A is a schematic plan view of an image reading device constituting an embodiment of the present invention.
Figure 2B:
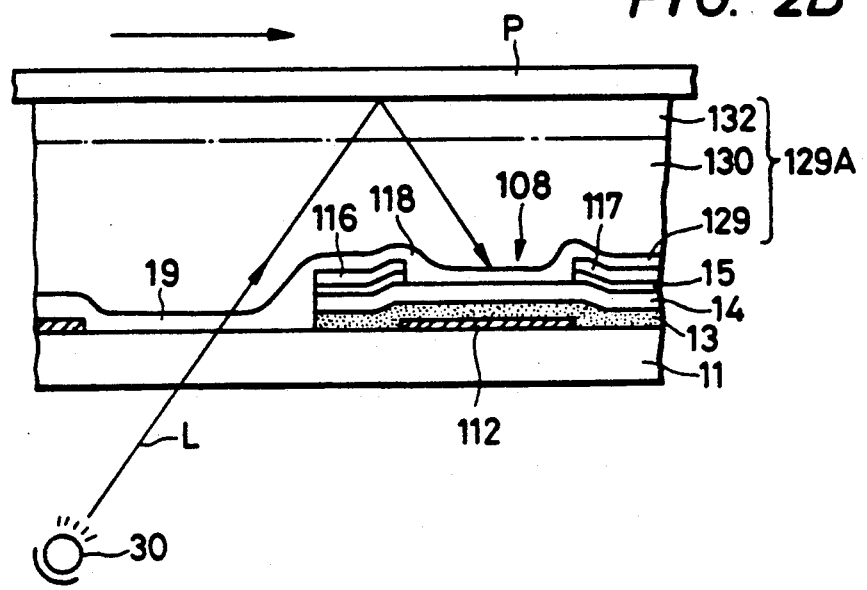
FIG. 2B is a cross-sectional view of the device along a line A—A in FIG. 2A.

FIGS. 2A and 2B are schematic view of a principal portion of an image reading device constituting a first embodiment of the present invention. FIG. 2A is a plan view of a sensor unit, and FIG. 2B is a cross-sectional view along a line A—A in FIG. 2A, while equivalent components to those in FIG. 1 are represented by corresponding numbers.

In a sensor unit 108 of the present embodiment, an opaque layer 112 is composed of a conductive material such as metal and is connected to a power source, for functioning as gate electrode for a main electrode (source) 116 and another electrode (drain) 117. Naturally the opaque layer 112 need not function as an electrode but can only be used for light interception, as shown in FIG. 1. The electrodes 116, 117 are formed in comb-like form and are placed in a mutually interlacing relation, whereby a light-receiving window 118 is formed in a meandering shape as shown in FIG. 2B, and a semiconductor layer 14 optically exposed through said window 118 receives the light reflected from an original document P to effect photoelectric conversion. On the sensor 108 there is provided a protective layer 129A of multi-layer structure, composed of a first layer functioning as a passivation layer, and a second layer 130 functioning at least as a spacer for maintaining a desired distance between the original P and the sensor 108.

The photosensor 108 shown in FIGS. 2A and 2B corresponds to 1 bit (1 cell) of image reading, but such cells may be linearly arranged on the substrate 11 to constitute a linear image sensor. For example, in order to obtain a resolving power of 8 pel/mm in the width direction of the original P (perpendicular to the moving direction thereof indicated by an arrow in FIG. 2B) over a width of 216 mm (corresponding to the A4-size), there should be arranged 1728 photosensors 108. Also it is possible to form the photosensor, a charge accumulating unit (capacitor) for accumulating the output of said photosensor, a switch unit for transferring thus accumulated charge for signal processing, and necessary wiring patterns on the same substrate through the same manufacturing procedure.

Figure 3A:
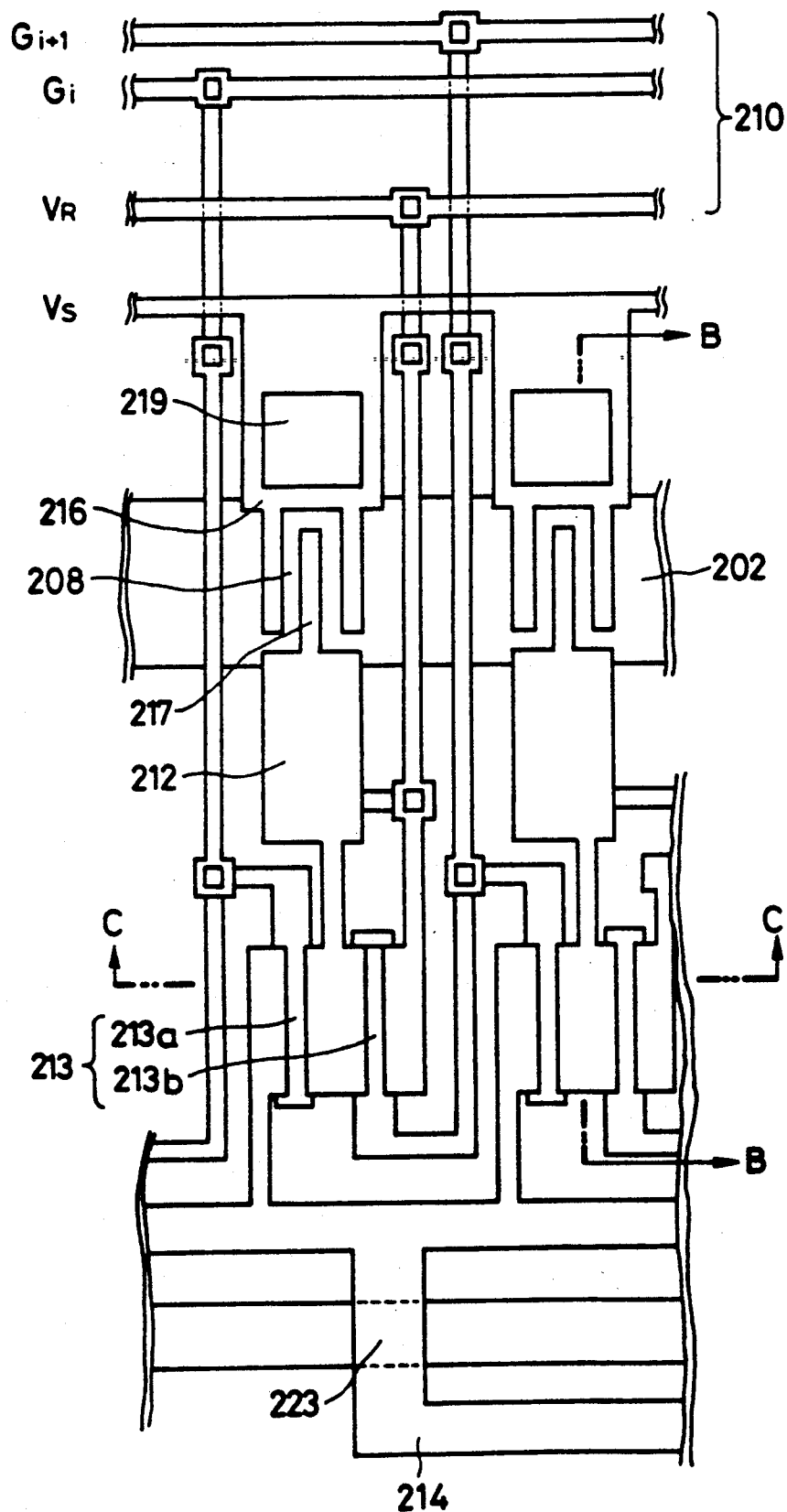
Figure 3B:
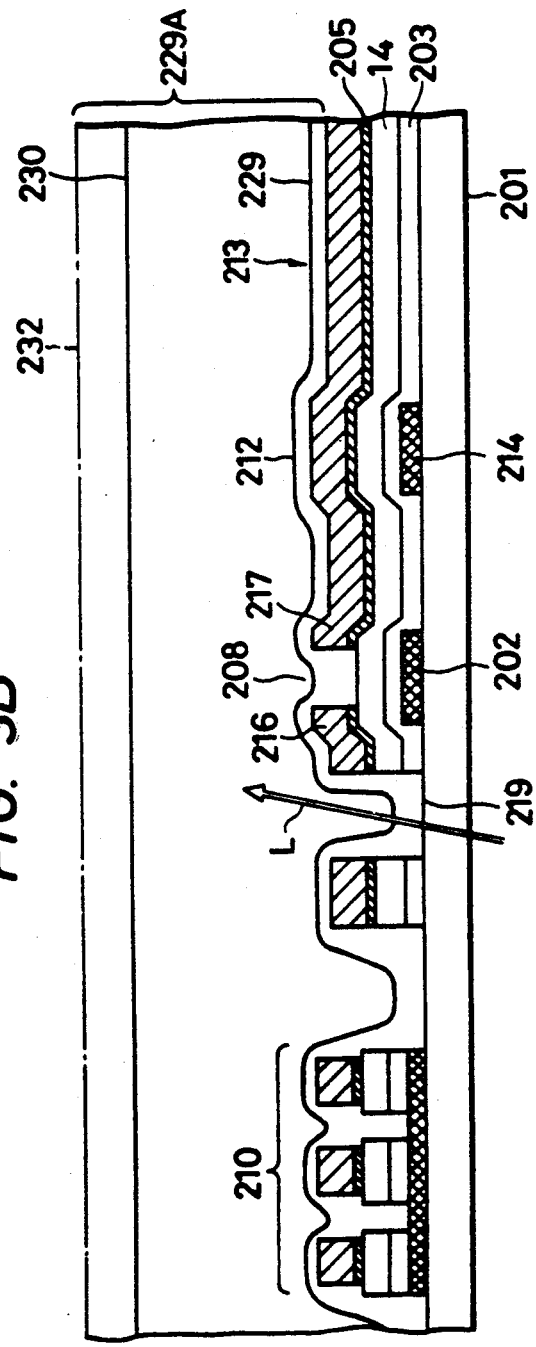
Figure 3C:
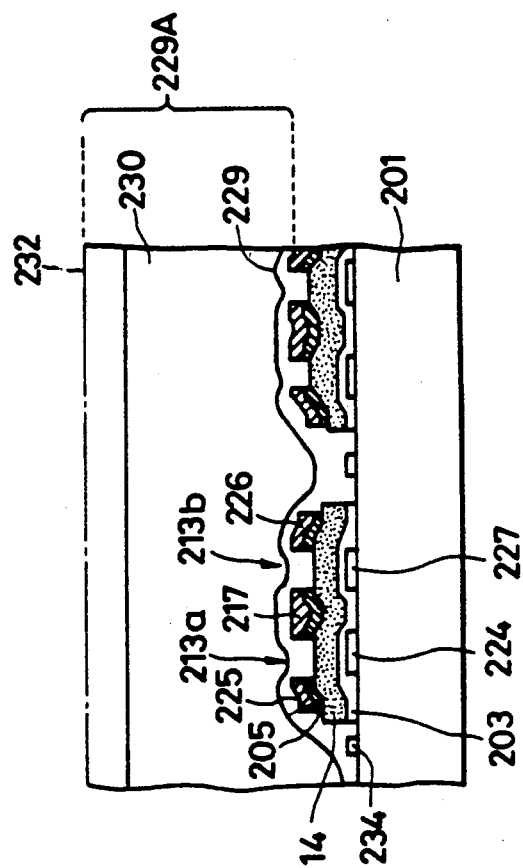

FIGS. 3A, 3B and 3C are respectively a plan view, a cross-sectional view along a line B—B therein and a similar view along a line C—C, of an embodiment of the image reading device in which the photosensor, charge accumulating unit and switch unit are integrated as explained above, wherein equivalent components to those in FIG. 1 are represented by same numbers.

In these figures, there are shown matrix wirings 210; a photosensor 208; a charge accumulating area 212; a switch unit 213 including a transfer switch 213a and a discharge switch 213b for discharging the charge in the accumulating area 212; a wiring 214 for transferring the output signal of the transfer switch to a signal processing unit to be explained later; and a load capacitor 223 for accumulating and reading the charge to be transferred by the transfer switch 213a.

In the present embodiment a photoconductive a-Si:H film is used as the semiconductor layer 14 constituting the semiconductor of the photosensor 208, transfer switch 213a and discharge switch 213b, and a silicon nitride (SiNH) film obtained by glow discharge is used as the insulating layer 203.

In FIG. 3A, for the purpose of simplicity, there are only illustrated upper and lower electrode wirings, but the photoconductive semiconductor layer 14, insulating layer 203 and protective layer 229A are omitted. The photoconductive semiconductor layer 14 and the insulating layer 203 are formed not only in the areas of the photosensor 208, charge accumulating area 212, transfer switch 213a and discharge switch 213b but also between the upper electrode wirings and the substrate in other areas. In addition, between the upper electrodes 216, 217 and the semiconductor layer 14, there is formed an $n^+$-doped a-Si:H layer 205 to form the ohmic contact.

In the linear sensor of the present embodiment, the wiring pattern from each sensor is so formed as not to cross other wirings, thereby preventing crosstalk between different signal components and induction noises from the gate electrode wiring. In FIGS. 3B and 3C, the protective layer 209A is composed of first and second layers 229, 230, as in the embodiment shown in FIGS. 2A and 2B.

The photosensor 208 has upper electrodes 216, 217. Light entering through the entrance window 219 and reflected by the original document varies the current in the semiconductor layer 14 between the upper electrodes 216, 217. A metal opaque layer 202 is connected, like the opaque layer 112, to a suitable power source.

The charge accumulating area 212 is composed of a lower electrode wiring 214; a dielectric member consisting of an insulator layer 203 formed on said wiring 214 and the semiconductor 14; and an electrode wiring 217A formed on the semiconductor layer 14 and extended from the upper wiring 217 of the photosensor. Said charge accumulating area 212 is constructed in the same manner as so-called MIS (Metal-Insulator-Semiconductor) capacitor. It may be biased positively or negatively, but the negative bias state of the lower electrodes wiring 214 provides a stable capacity and a stable frequency characteristic.

FIG. 3C shows the switch unit 213 of a thin film transistor (TFT) structure including the transfer switch 213a and the discharge switch 213b, wherein the transfer switch 213a is composed of a lower electrode wiring 224 constituting a gate electrode; the insulator layer 203 constituting a gate insulator; the semiconductor layer 14; an upper electrode wiring 225 constituting a source electrode; and an upper electrode wiring 217 constituting a drain electrode.

As explained in the foregoing, between the upper electrode wirings 217, 225, 226 and the photoconductive semiconductor layer 14 there is provided the n+-doped a-Si:H layer for forming the ohmic contact.

In the above-explained image reading device shown in FIGS. 3A, 3B and 3C, all the photosensor, charge accumulating area, transfer switch, discharge switch and matrix wirings have the same multi-layer structure including a photoconductive semiconductor layer, an insulating layer and an intermediate layer, and can therefore be formed simultaneously through the same process.

In the following there will be explained an example of the protective layer 129A or 229A constituting a feature of the present invention. The protective layer is composed, in its most basic multi-layer structure, of a first layer and a second layer.

First layer

At first there will be explained materials usable in the present invention as the first layer 129 or 229 shown in FIGS. 2B, 3B and 3C.

For the purpose of relaxing the stress between the substrate and the second layer to be explained later, the first layer is preferably of a lower hardness (for example Vickers hardness) and a high purity than in the second layer and capable of stabilizing the surface of the photosensor 108, 208. A representative example of such material is silicone resin, such as a gel resin known under a trade name JCR6110 supplied by Toray Silicone Co., Ltd., or a rubber type resin known under a trade name XE13-611, XE13-642 or XE14-520 supplied by Toshiba Silicone Co., Ltd. The former can be formed easily as a thin film because of a low viscosity, but the adhesion properties is slightly low. The latter provides a thick layer because of a high viscosity, but shows satisfactory adhesion. These materials can be suitably selected in consideration of the material of the second layer as explained above. Such silicone resins should preferably be selected in consideration of the alkali ion content as will be explained later.

Also the first layer may be composed of a photoresist material, for example a UV-curable negative photoresist known under a trade name RFG from Sekisui Chemical Co., Ltd., a deep UV-curable photoresist known under a trade name ODUR-110WR from Tokyo Oka Co., Ltd., a negative photoresist known under a trade name OMR-83 from Tokyo Oka Co., Ltd. or a trade name CBR from Japan Synthetic Rubber Co., Ltd., the former being featured by a low cost while the latter being featured by a high heat resistance.

Also there can be employed a deep UV-curable positive photoresist such as FPM 210 or FPM 120 from Daikin Co., Ltd., or a positive photoresist such as OFPR-800 from Tokyo Oka Co., Ltd.

Among negative photoresists, OMR-83 or CBR mentioned above enables fine patterning but has a drawback of being yellow. However light loss can be prevented by employing an illuminating light source 30 of yellow or yellow-green light. Positive photoresists are more expensive and of lower adhesion compared with negative ones, but allow fine patterning as in the negative ones. The above-mentioned OFPR-800 is colored red, but light loss can be prevented by the use of a suitable light source 30. Such photoresists are preferable because the alkali ion content is negligibly low.

In the following there will be explained the result of investigation on the material and thickness of the first layer 129 or 229.

Figure 5:
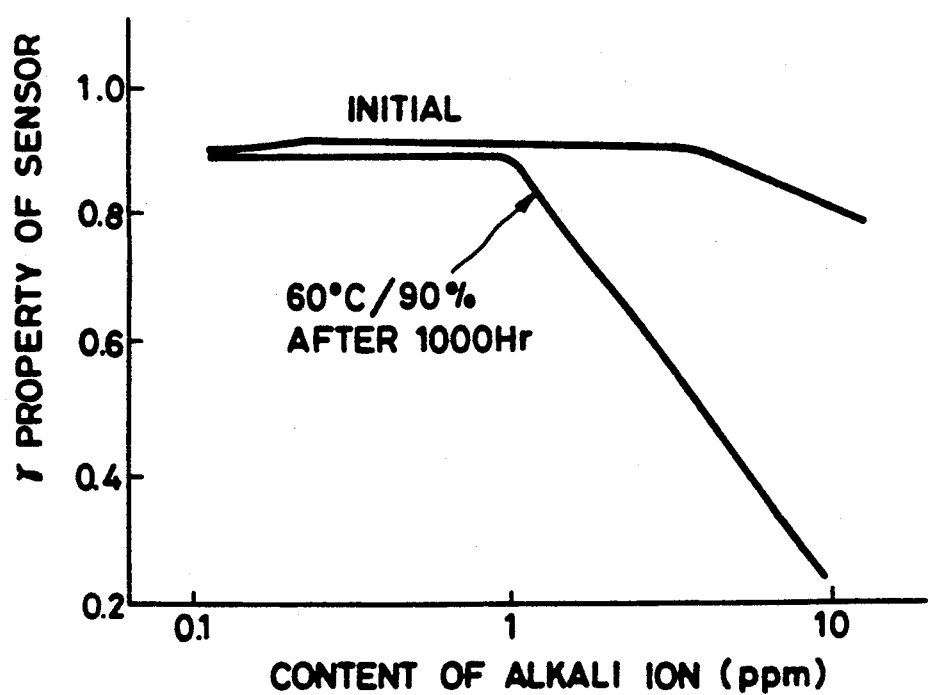
FIG. 5 is a graph showing the characteristic of an intermediate layer forming material, usable for an intermediate layer constituting a part of the protective layer of the present invention.

Investigation of alkali ion content in the first layer composed of silicon resin FIG. 5 shows the characteristic of the photosensor, overcoated with silicone resins of varying alkali ion content from 0.1 to 10 ppm, as the first layer. With the increase in the alkali ion content, the photosensor 108 or 208 showed an increase in the dark current and a deterioration of the $\gamma$ property, indicating the linearity to the light amount, thereby resulting in a deteriorated image quality.

Also in the image reading device of the embodiment shown in FIG. 3, an increase in the alkali ion content in the first layer 225 decreased the off-resistance of the TFT switch 213, thus resulting in an insufficient on/off ratio.

From these facts, it is found out that the alkali ion content of the first layer composed of silicon resin should not preferably exceed 1 ppm. In fact a material selected in this manner provided satisfactory stable results on the photosensor characteristic and durability test. Also in the image reading device shown in FIG. 3, there was not deterioration in the switch characteristic.

Investigation on thickness of the first layer

Characteristic of the first layer 129, 229 was investigated at various thicknesses. A small thickness resulted in pinholes, resulting in an insufficient function for passivation. On the other hand, an execessively large thickness not only results in a significant decrease in light transmission if it is composed of a colored material such as photoresist, but, also a limitation in the forming method since the second layer 130, 230 has to be made thinner. Consequently it is concluded that the thickness of the first layer should be in a range of 0.05 to 20 μ preferably 0.1 to 10 μ.

Investigation on the refractive index of the first layer

The refractive index of the first layer 229 was investigated, because, in the image reading device shown in FIG. 3, the light entering the device may be introduced as stray light into the TFT switch 213.

Figure 6:
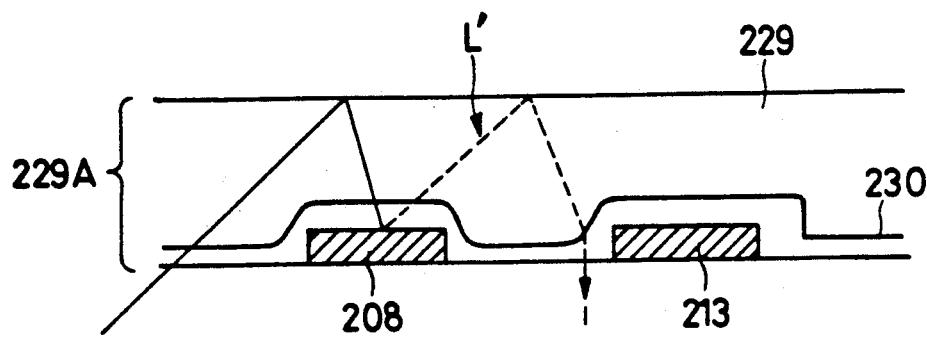
FIG. 6 is a schematic view showing the effect of an embodiment shown in FIGS. 3A, 3B and 3C.

FIG. 6 schematically shows a principal portion of the image reading device shown in FIG. 3. A refractive index of the first layer 229 different from that of the second layer 230, for example smaller than the latter in the illustrated example, can cause multiple reflections in the second layer 230, thereby reducing the stray light entering the switch 213 and obtaining satisfactory switch characteristic. Consequently it is desirable to select the materials of the first and second layers, so as to generate a difference in refractive index therebetween, said difference being preferably as large as possible.

Second layer

The second layer (129, 229) at least functioning as a spacer for preventing the abrasion by the original document P and precisely controlling the resolving power in image reading can be composed of a coating of a translucent and for example photocurable organic resin, on the first layer. In such case, said resin may be coated with a thickness of 0.01-0.5 mm, preferably about 0.1 mm as shown in FIG. 2 or 3, after the first layer is formed with photoresist or silicone resin.

Also, if the second layer is composed of glass, a thin glass plate of a thickness for example of 0.1 mm can be placed without air gap after the first layer is formed flat with photoresist or silicone resin. Said glass plate can be a product known under a trade name BLC supplied by Nihon Denki Glass Co., Ltd., when the second layer is composed of such glass plate, said first layer has to also function as an adhesive layer.

Figure 4A:
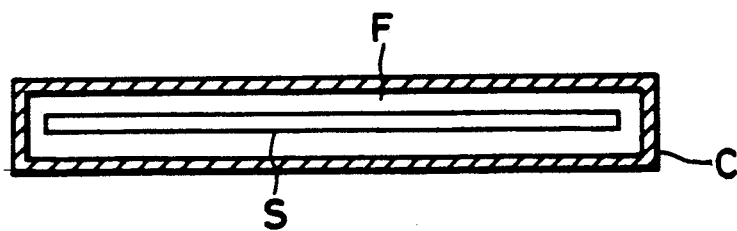
FIGS. 4A and 4B are schematic views of an embodiment of the protective layer of the image reading device of the present invention.
Figure 4B:
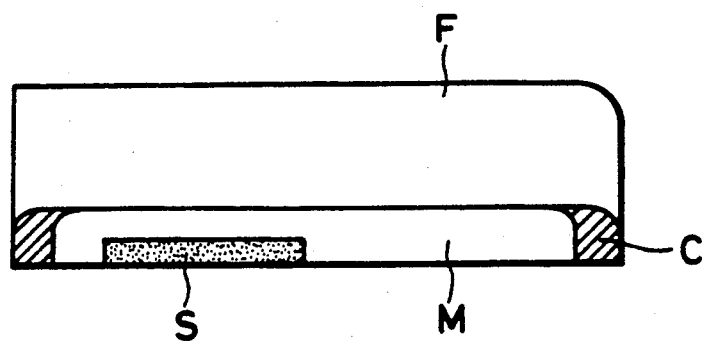

Also the second layer may be composed of a film, for example a polyester film with a hard silicon coating, such as a product of Toray Co., Ltd. known under a trade name Toughtop, or a polyester film with a hard acrylic coating, such as a product of Mitsubishi Rayon Co., Ltd. known under a trade name of Diabeam. In such case the first layer will not function as an adhesive layer, so that an adhesive material may be applied around the photosensor and the first layer for adhering the film, as shown in FIGS. 4A and 4B.

Example of a protective layer (129A, 229A)

On the photosensor (108, 208) shown in FIGS. 2 and 3, the above-explained first layer (129, 229) was formed by coating photoresist (OMR-83 from Tokyo Oka) with a spinner in a thickness of ca. 1 μ so as to obtain a flat surface and curing said photoresist in usual manner. Then a thin glass plate was adhered as the second layer (130, 230) on said first layer (129, 229) with transparent adhesive to obtain the image reading device shown in FIG. 2 or 3. The photosensor (108, 208) of said device showed satisfactory characteristics and image quality after continuous reading. No deterioration in the characteristics of photosensor nor mechanical defects such as cracking were found in prolonged durability tests (heat cycles and operations at high temperature and high humidity). Also no deterioration of the switch characteristics was found in the structure shown in FIG. 3.

Another example of a protective layer

In the foregoing embodiments there has been explained a protective layer of two-layered structure consisting of first and second layers of separate functions. In the present embodiment the protective layer has a three-layered structure having a surface layer (132, 232) as indicated by a chain line in FIG. 2A or FIGS. 3B and 3C. The protective layer (129A, 229A) is required not only to perform a spacer function but also to improve the stability of the photosensor in ambient conditions and the abrasion resistance and the sliding property to the original document P. In the present embodiment, therefore, the protective layer (129A, 229A) is provided with the first layer as a passivation film for the photosensor, and a surface layer (132, 232) at the surface of said protective layer for improving the abrasion resistance or sliding property. Also such structure widens the freedom of material selection for each layer constituting the protective layer (129A, 229A).

In consideration of the productivity, the protective layer (129A, 229A) is preferably formed of organic resins that can be coated, for example photocurable resins, thermosetting resins, photosensitive resins etc. In such case, polycarbonate, polysiloxane resins, acrylic resins etc. have high transparency, but have not been used at the surface of the protective layer (129A, 229A) because of high friction coefficient.

In the present embodiment, therefore, there is provided a surface layer (132, 232) of a friction coefficient smaller than that of the second layer (130, 230), thereby improving the abrasion resistance and sliding property to the original document P achieved by said surface layer (132, 232), further widening the freedom of material selection for the second layer (130, 230) and improving the precision of image reading. For example, the second layer (130, 230) may be formed of a material of high friction coefficient that could not be used conventionally.

The surface layer (132, 232) can be composed, for example, of tetrafluoroethylene, melamine resin, urea resin, nylon, polyethylene, acetal resin or acetal resin added with fluorinated resin. However, these materials, having insufficient transparence, are preferably used with a suitable thickness, in order to prevent loss in the light amount.

The surface layer (132, 232) can be obtained by forming a thin layer of the above-mentioned material on the second layer (130, 230), or by applying, on the second layer (130, 230), the same resin of said second layer to which added is resin powder for improving the sliding property.

The protective layer of the above-mentioned three-layered structure not only improves the durability of the device and the ambient stability of the photosensor as in the foregoing embodiments, but also improves the abrasion resistance and sliding property to the original document and widens the freedom of selection of the materials constituting the protective layer, thereby ensuring an increased reliability of the device.

Figure 7:
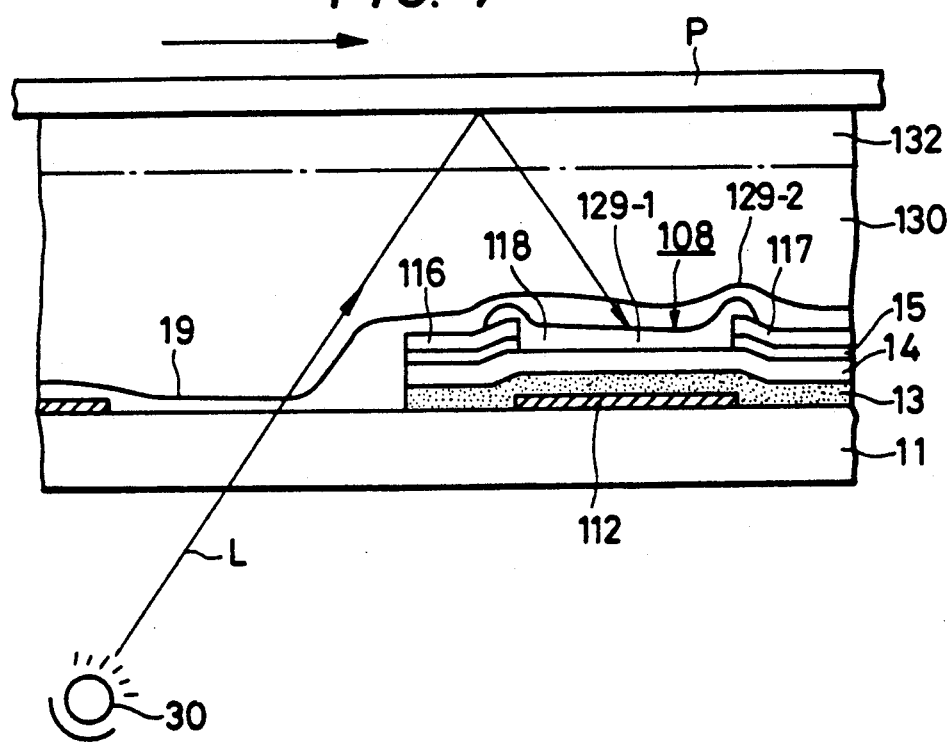
FIG. 7 is a schematic lateral cross-sectional view of a principal portion of a third embodiment of the present invention.

FIG. 7 shows an embodiment of a first layer which is multi-layered and composed of two layers 129-1, 129-2 of different materials. The first layer is composed of a first intermediate layer 129-1 and a second intermediate layer 129-2 formed thereon, and the second layer 130 is formed thereon. The first intermediate layer 129-1, being in direct contact with the photosensor 108, is required to stabilize the surface characteristics of the photosensor 108. For this reason the first intermediate layer 129-1 should be composed of a highly pure material, for example an inorganic material such as $SiO_2$ film or SiNH film, or an organic material such as polyimide resin allowing easy film formation, supplied by Hitachi Chemical under a trade name LP-52.

Also the second intermediate layer 129-2 can be given a good moisture resistance and can be composed for example of epoxy resin, preferably a product of Sumitomo Bakelite Co., Ltd. under a trade name ECR-/ECH 7120. The second layer 130 can be composed of a material of high abrasion resistance and high optical transmission, such as borosilicate glass, preferably a product of Nihon Denki Galss Co., Ltd. supplied under a trade name BLC. In this case the second intermediate layer 129-2 is preferably composed of a material having adhesive property.

In the present embodiment, the first layer composed of the first intermediate layer 129-1 and the second intermediate layer 129-2 of different functions allows to obtain an image reading device of further improved reliability and stability.

Also in the structure shown in FIG. 3, the first layer 229 may naturally be divided into a first intermediate layer covering at least the photosensor 208 and the switch area 213, and a second intermediate layer provided thereon.

Furthermore, in the present embodiment, there may be provided, as indicated by a chain line in FIG. 7, a surface layer 132 of a function similar to that explained in relation to FIGS. 2 and 3.

Figure 8:
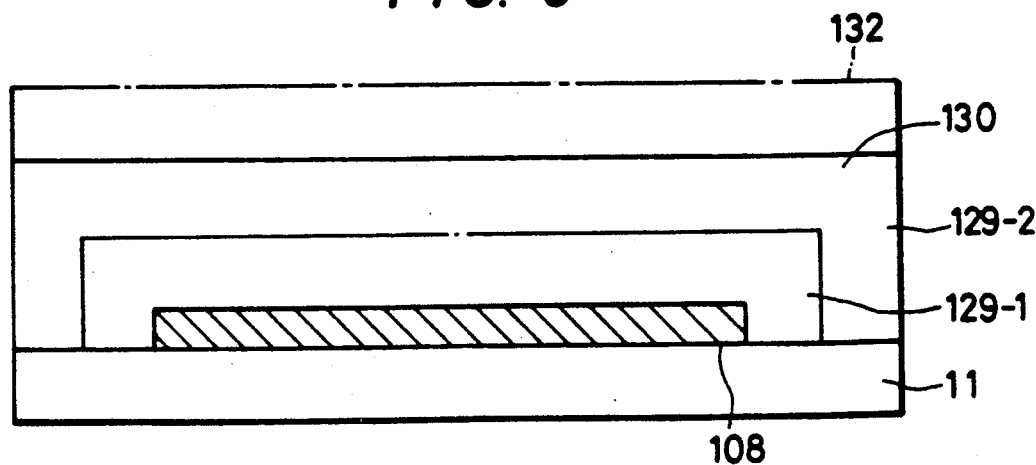
FIG. 8 is a schematic view of a principal portion of a fourth embodiment of the present invention.

FIG. 8 shows a principal portion of an image reading device which has a similar structure as in FIG. 7 but the first intermediate layer 129-1 is packaged in the second intermediate layer 129-2. In the present embodiment, the first intermediate layer 129-1 is formed only in the necessary areas (areas of photosensor and switch in the structure shown in FIG. 3), and the second intermediate layer 129-2 is so formed as to surround said first intermediate layer, for achieving additional functions such as moisture resistance. The present embodiment can further improve the reliability such as stability against ambient conditions.

Also in the present embodiment there may be naturally provided, as indicated by a dotted line in FIG. 8, a surface layer 132 of a function same as that of the surface layer explained already in relation to FIGS. 2 and 3.

Furthermore, even when the first layer is composed of a single layer, the second layer may be so formed as to surround the first layer.

In the foregoing description, the photosensor is of planar type having a gap between main electrodes, but there may also be employed a photosensor of so-called sandwich structure in the present invention.

As explained in the foregoing, the present invention, providing a protective layer of multilayer structure of plural layers of separate functions for protecting the photosensor, allows to widen the freedom of material selection for each layer, thereby achieving the photosensor and switch characteristics equivalent to those in a single layered structure with ideal materials in the protective layer, thus providing an image reading device of high reliability, capable of stable image reading.

We claim:

1. An image sensor comprising:
   a substrate having a light-permeable section;
   a plurality of photosensors disposed on said substrate; and
   a protective layer provided on said photosensors,
   wherein said protective layer includes a plurality of layers of different materials, one of said layers being provided on said photosensors while another one of said layers is provided on said one of said layers, said another one of said layers being larger in spread than said one of said layers.

2. An image sensor according to claim 1, wherein said one of said layers is an adhesive and said another one of said layers is a glass.

3. An apparatus comprising:
   an image sensor including:
   a substrate comprising a light-permeable section,
   a plurality of photosensors disposed on said substrate, and
   a protective layer provided on said photosensors,
   wherein said protective layer includes a plurality of layers of different materials, and one of said layers is provided on said photosensor while another one of said layers is provided on said one of said layers, said another one of said layers being larger in spread than said one of said layers;
   a light source for illuminating an original carrying information thereon; and
   means for conveying the original in a manner such that the original is in contact with said protective layer of said image sensor.

4. An apparatus according to claim 3, wherein said apparatus is a facsimile machine.

5. An apparatus according to claim 3, wherein said apparatus is an image reader.

* * * * *